(12) United States Patent
Kugler et al.

(10) Patent No.: US 9,904,175 B2
(45) Date of Patent: Feb. 27, 2018

(54) EUV IMAGING APPARATUS

(71) Applicant: Carl Zeiss SMT GmbH, Oberkochen (DE)

(72) Inventors: Jens Kugler, Aalen (DE); Stefan Hembacher, Bobingen (DE); Michaela Schmid, Winterthur (CH)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/937,340

(22) Filed: Nov. 10, 2015

(65) Prior Publication Data

US 2016/0077441 A1 Mar. 17, 2016

Related U.S. Application Data

(63) Continuation of application No. PCT/EP2014/061719, filed on Jun. 5, 2014.

(30) Foreign Application Priority Data

Jun. 17, 2013 (DE) .......... 10 2013 211 310

(51) Int. Cl.
*G03B 27/42* (2006.01)
*G03F 7/20* (2006.01)
*G02B 7/182* (2006.01)

(52) U.S. Cl.
CPC ......... *G03F 7/7015* (2013.01); *G02B 7/1828* (2013.01); *G03F 7/709* (2013.01); *G03F 7/70258* (2013.01); *G03F 7/70825* (2013.01); *G03F 7/70833* (2013.01)

(58) Field of Classification Search
CPC .... G02B 7/003; G02B 27/62; G02B 27/1073; G02B 27/646; G02B 7/00; G03F 7/70141; G03F 7/70258; G03F 7/70775; G03F 7/7085; G03F 7/70725; H04N 2223/54426; H04N 5/2254
See application file for complete search history.

(56) References Cited

U.S. PATENT DOCUMENTS

| | | |
|---|---|---|
| 2003/0234989 A1 | 12/2003 | Oshino et al. |
| 2004/0212794 A1 | 10/2004 | Mizuno |
| 2004/0227107 A1 | 11/2004 | Cox et al. |
| 2004/0257549 A1 | 12/2004 | Leenders et al. |

(Continued)

FOREIGN PATENT DOCUMENTS

| | | |
|---|---|---|
| CN | 1550904 A | 12/2004 |
| CN | 101563638 A | 10/2009 |

(Continued)

OTHER PUBLICATIONS

International Search Report and Written Opinion for corresponding PCT Appl. No. PCT/EP2014/061719, dated Aug. 25, 2014.

(Continued)

*Primary Examiner* — Mesfin Asfaw
(74) *Attorney, Agent, or Firm* — Fish & Richardson P.C.

(57) ABSTRACT

An EUV imaging apparatus is provided, which includes a reference structure and a first optical element, which is actuatable relative to the reference structure with the aid of a first actuator. The first actuator is a self-holding actuator. The apparatus includes a second optical element, which is actuatable relative to the reference structure a second actuator. The second actuator is a non-self-holding actuator.

21 Claims, 4 Drawing Sheets

(56) References Cited

U.S. PATENT DOCUMENTS

| | | |
|---|---|---|
| 2005/0275822 A1 | 12/2005 | Butler |
| 2008/0028816 A1 | 2/2008 | Slor et al. |
| 2009/0080086 A1 | 3/2009 | Shafer et al. |
| 2011/0170078 A1 | 7/2011 | Loopstra et al. |
| 2012/0188526 A1 | 7/2012 | Oshino et al. |
| 2012/0241268 A1 | 9/2012 | Hendrikus et al. |
| 2013/0141707 A1 | 6/2013 | Baer et al. |
| 2016/0195818 A1 | 7/2016 | Baer et al. |

FOREIGN PATENT DOCUMENTS

| | | |
|---|---|---|
| CN | 102165373 A | 8/2011 |
| CN | 102185540 A | 9/2011 |
| CN | 103038708 A | 4/2013 |
| DE | 10 2008 041 301 A1 | 4/2009 |
| EP | 1 879 218 A1 | 1/2008 |
| JP | 2004-343078 | 12/2004 |
| JP | 2006-024919 | 1/2006 |
| JP | 2008-047622 | 2/2008 |
| JP | 2009-536373 | 10/2009 |
| JP | 2011-077142 | 4/2011 |
| JP | 2012-033924 | 2/2012 |
| WO | WO 2013/004278 | 1/2013 |

OTHER PUBLICATIONS

Chinese Office Action and Search Report, with translation thereof, for corresponding CN Appl No. 201480033769.1, dated Aug. 2, 2016.

Japanese Office Action with translation thereof for corresponding JP Appln. No. 2016-520364, dated Oct. 12, 2016.

Japanese Office Action with English translation thereof for corresponding JP Application No. 2016520364, dated Oct. 3, 2017, 9 pages.

Chinese Office Action, with translation thereof, for corresponding CN Appl No. 201480033769.1, dated Apr. 5, 2017.

Korean Notice of Preliminary Rejection, with translation thereof, for corresponding KR Appl No. 10-2016-7000826, dated Mar. 3, 2017.

Chinese Office Action, with translation thereof, for corresponding Appl No. 201480033769.1, dated Jan. 4, 2018.

Taiwanese Office Action and Search Report, with translation thereof, for corresponding Appl No. 103120682, dated Nov. 21, 2017.

EUV IMAGING APPARATUS

CROSS-REFERENCE TO RELATED APPLICATIONS

This application is a continuation of, and claims priority under 35 U.S.C. § 120 to, international patent application PCT/EP2014/061719, filed Jun. 5, 2014, which claims benefit under 35 U.S.C. § 119 of German Patent Application No. 10 2013 211 310.2, filed on Jun. 17, 2013. The entire contents of these applications are incorporated herein by reference.

FIELD

The disclosure relates to an EUV imaging apparatus, such as e.g. an EUV lithography apparatus including a plurality of optical elements, in particular mirrors.

BACKGROUND

Lithography apparatuses are used, for example, in the production of integrated circuits (ICs) for imaging a mask pattern in a mask onto a substrate such as e.g. a silicon wafer. In the process, a light beam produced by an illumination apparatus is directed to the substrate through the mask. An exposure lens, consisting of a plurality of optical elements, serves to focus the light beam on the substrate.

The extent of the smallest structure elements that can be realized on the wafer is proportional to the wavelength of the light utilized for the exposure, and inversely proportional to the numerical aperture of the optical elements (lens elements or mirrors) utilized for beam shaping. In order to meet the requirements of ever smaller structures, a development focused on light sources with ever shorter wavelengths, which development culminated in EUV (extreme ultraviolet) light sources with a wavelength of between 5 nm and 30 nm (e.g. 13 nm). Such low wavelengths enable imaging of the smallest structures on the wafer. Since light in this wavelength range is absorbed by atmospheric gases, the beam path of such EUV lithography apparatuses is situated in a high vacuum. Furthermore, there is no material sufficiently transparent in the aforementioned wavelength range, which is why use is made of mirrors as optical elements for shaping and guiding the EUV radiation. The second precondition for small structure dimensions, namely a high numerical aperture, means that the employed mirrors have to be very large and near-wafer mirrors may have a diameter of e.g. 300 to 500 mm or more. Such large mirrors generally have a relatively large mass, which in turn places increased constraints on a low-deformation mount and actuation.

An option for mounting or actuating optical elements, such as e.g. mirrors in a lithography apparatus, lies in mounting via piezoelectric actuators. Examples therefor are disclosed in US2004/0212794A1, EP 1 879 218 A1 and US2003/0234989A1.

Document US2004/257549A1 describes a lithographic apparatus, a projection system, a method of projecting and a device manufacturing method. The projection system includes at least one projection device configured to receive a beam of radiation coming from a first object and project the beam to a second object. The projection system further includes a sensor configured to measure a spatial orientation of the at least one projection device and a processing unit configured to communicate with the at least one sensor. The processing unit is configured to communicate with a positioning device configured to adjust the position of at least one of the first object and the second object based on the measured spatial orientation of the at least one projection device.

Moreover, document US2004/227107A1 shows a lithographic apparatus and a manufacturing method. Further, US2004/227107A1 describes that, in a projection system for EUV, the positions of mirrors are measured and controlled relative to each other, rather than to a reference frame. Relative position measurements may be made by interferometers or capacitive sensors mounted on rigid extensions of the mirrors.

However, systems with piezoelectric actuators are reaching their limits in view of the increasing demands when positioning. In order to meet these increasing demands, holders or mounts with Lorentz actuators have been proposed, in which plunger coils are employed as drive for correcting the location of optical elements. In addition to more precise positioning, such Lorentz actuators also have various other advantages over piezoelectric actuators, such as e.g. lower rigidity, greater robustness against environmental influences and smaller parasitic effects. However, mounting the optical elements by way of Lorentz actuators is linked to a greater complexity of the system, since this is an active mount, in which the location of the optical elements is continuously corrected.

BRIEF SUMMARY

The disclosure seeks to provide an EUV imaging apparatus, by which it is possible to reduce the complexity of the apparatus and hence lower the production costs. In one aspect, the disclosure provides an EUV imaging apparatus including a reference structure, a first optical element, which is actuatable relative to the reference structure with the aid of a first actuator, the first actuator being a self-holding actuator, and a second optical element, which is actuatable relative to the reference structure with the aid of a second actuator, the second actuator being a non-self-holding actuator. Using such a hybrid system, it is possible to employ the advantages of active and semi-active holding or mounting techniques. As a result, it is possible to reduce the complexity, and hence the production costs, of the EUV imaging apparatus.

Here, provision can be made for the first optical element to be in a near-pupil arrangement and/or for the second optical element to be in a near-field arrangement. In other words, near-field optical elements can thus preferably be mounted in an active manner and near-pupil optical elements can preferably be mounted in a semi-active manner.

In a first configuration of this hybrid system, the first optical element is mounted on a first support structure, which is attached to the reference structure, and the second optical element is mounted on a second support structure, which is attached to the reference structure. In this hybrid system, it is advantageous if provision is made for at least one reaction mass for compensating forces generated during the actuation of the second optical element, since this renders it possible to prevent reaction forces generated during the actuation of the second optical element from being transferred to the reference structure.

In a further configuration of the hybrid system, the first optical element is mounted on a first support structure, which is attached to the reference structure, and the second optical element is mounted on a second support structure, which is mechanically decoupled from the reference structure. In this configuration, it is possible to dispense with the reaction masses for compensating the reaction forces during the actuation of the second optical element.

Since the first actuator is self-holding, it is sufficient to actuate it at regular intervals, or as a response to an external signal, in order to correct the position thereof. By contrast, it is advantageous to correct the location of the second actuator continuously with the aid of a control loop. In this case, "correct . . . continuously" can mean, for example, that the control loop is actively operated at least from time to time, for example during the exposure of a wafer, and holds the second optical element in an intended location during this time interval.

Examples for the first actuator are piezoelectric actuators, magnetostrictive actuators or linear motors. By way of example, the second actuator can be a Lorentz actuator. By way of example, the first and the second optical elements can be mirror elements of the EUV imaging apparatus. Here, several, or else all, near-field mirror elements can be mounted in an active manner. Furthermore, several, or else all, near-pupil mirror elements can be mounted in a semi-active manner.

The optical sensitivity of the second optical element can be greater than the optical sensitivity of the first optical element. Here, a "greater optical sensitivity" should be understood to mean that the influence of a possible form deformation or possible depositioning in the case of an optical element with greater optical sensitivity results in a larger aberration than in the case of the same form deformation or depositioning of an optical element with smaller optical sensitivity. Thus, a greater optical sensitivity can mean that an identical positioning error of the optical element leads to a larger imaging error.

In a further configuration, provision is made for a first sensor device, which determines the position of the first optical element directly on the first optical element. Here, "directly on the first optical element" can mean e.g. that no attachment areas or interfaces, which are subject to relaxation processes or environmental influences, are provided between a measurement region of the sensor device and the optical element. In particular, the sensor device can be arranged directly on the optical element, e.g. on the rear side thereof. If the first optical element is a mirror, the position thereof can be registered e.g. via a sensor device which determines a region on the edge or on the rear side of the mirror. Hence, it is possible to avoid measurement errors due to sensor drift. This is advantageous, in particular, if the first optical element serves as a reference mirror or, in other words, if the position of the first optical element serves as reference for positioning the second optical element.

Furthermore, the EUV imaging apparatus can include a second sensor device for determining the position of the second optical element, wherein the first sensor device is configured to determine the position of the first optical element at specific time intervals or as a response to an external signal, and the second sensor device is configured to determine the position of the second optical element continuously. Hence, the first actuator can be actuated at periodic intervals or as a response to an external signal in order to correct the location thereof, whereas the location of the second actuator can be corrected continuously with the aid of a control loop.

By way of example, the EUV imaging apparatus can be an EUV lithography apparatus or a mask metrology apparatus.

Further exemplary embodiments will be explained with reference to the accompanying drawings.

EMBODIMENTS OF THE DISCLOSURE

Unless indicated otherwise, identical reference signs in the figures designate identical or functionally identical elements. Furthermore, it should be noted that the illustrations in the figures are not necessarily true to scale.

In the following text, aspects of the disclosure are intended to be explained on the basis of an EUV lithography apparatus as an example for an EUV imaging apparatus. Here, the optical elements of the EUV lithography apparatus are first of all depicted on the basis of FIG. 1. Aspects in respect of mounting are then discussed in the further FIGS. 2, 3 etc.

Figure 1:
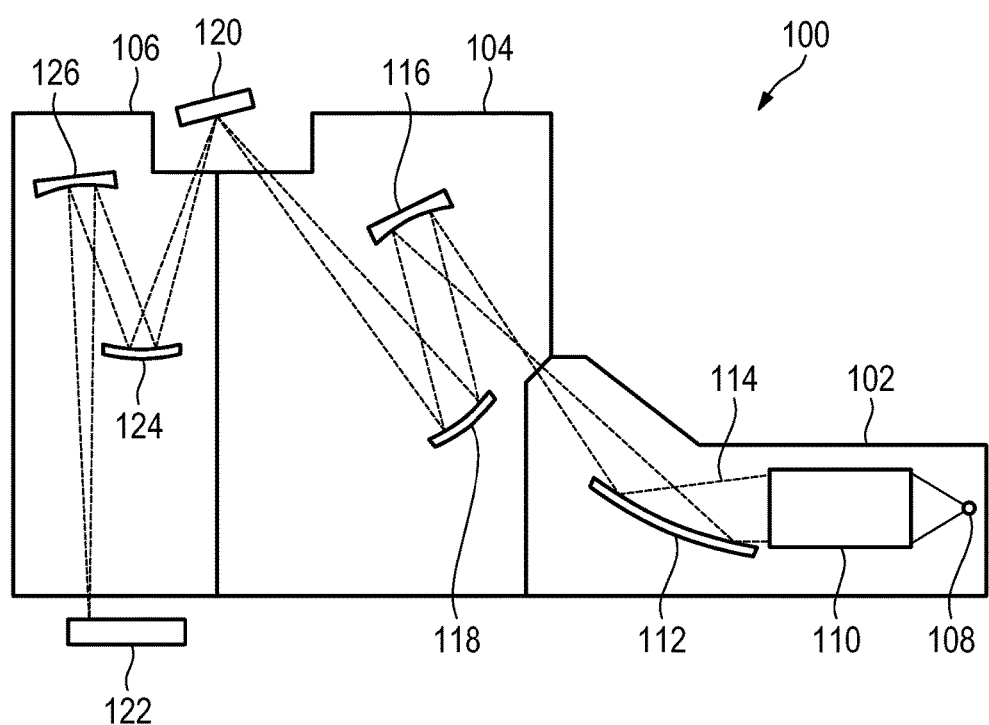
FIG. 1 shows a schematic view of an EUV lithography apparatus in accordance with one embodiment.

FIG. 1 shows a schematic view of an EUV lithography apparatus 100 in accordance with one embodiment including a beam shaping system 102, an illumination system 104 and a projection system 106. The beam shaping system 102, the illumination system 104 and the projection system 106 are respectively provided in a vacuum housing, which can be evacuated with the aid of an evacuation apparatus (not depicted in any more detail here). The vacuum housings are surrounded by a machine room (not depicted in any more detail here), in which e.g. the drive apparatuses for mechanically displacing or setting the optical elements are provided. Furthermore, it is also possible to provide electrical controls and the like in this machine room.

The beam shaping system 102 includes an EUV light source 108, a collimator 110 and a monochromator 112. By way of example, a plasma source or a synchrotron, which emit radiation in the EUV range (extreme ultraviolet range), i.e., for example, in the wavelength range between 5 nm and 20 nm, can be provided as EUV light source 108. The radiation emerging from the EUV light source 108 is initially focused by the collimator 110, following which the desired operating wavelength is filtered by the monochromator 112. Hence the beam shaping system 102 adapts the wavelength and the spatial distribution of the light radiated by the EUV light source 108. The EUV radiation 114 generated by the EUV light source 108 has a relatively low transmissivity through air, which is why the beam guidance spaces in the beam shaping system 102, in the illumination system 104 and in the projection system 106 are evacuated.

In the depicted example, the illumination system 104 includes a first mirror 116 and a second mirror 118. By way of example, these mirrors 116, 118 can be embodied as facet mirrors for pupil shaping and guide the EUV radiation 114 to a photomask 120.

The photomask 120 is likewise embodied as a reflective optical element and may be arranged outside of the systems 102, 104, 106. The photomask 120 has a structure, which is imaged in a reduced manner on a wafer 122, or the like, via the projection system 106. To this end, the projection system for example includes a third mirror 124 and a fourth mirror 126 in the beam guidance space 106. It should be noted that the number of mirrors of the EUV lithography apparatus 100 is not restricted to the depicted number, and provision can also be made for more or fewer mirrors. Moreover, the mirrors are generally curved on the front side thereof for beam shaping purposes.

In order to be able to actuate the individual optical elements or mirrors of the EUV lithography apparatus 100, and thereby be able to correct the position thereof, these are each provided with an actuation system rendering it possible to displace the mirrors over a predetermined range. The desired properties of the respective actuation system are directed to substantially three aspects, namely dynamics, SFD (surface deformations) and range, which aspects partly contradict one another. For example, the dynamics involve a rigid connection between the optical elements and the structure supporting them. However, due to manufacturing and installation tolerances and ranges, this can lead to high parasitic forces on the optical element and hence too large surface deformations on the optical elements. Thus, in order to ensure low surface deformations, it is important to develop a soft connection, which contradicts the desired properties of the dynamics. In the case of given admissible forces and moments, a large actuator range involves soft manipulator kinematics, which likewise contradicts the desired properties of dynamics. In the case of a given rigidity, large ranges lead to large parasitic forces and moments, and hence also to large surface deformations.

Since, as highlighted above, the desired properties of dynamics, SFD and range contradict one another, it is desirable to find equilibrium between these. The lower the requirements of the optical element are, and the less sensitively the optical element reacts to parasitic forces and moments, the easier it is to find such equilibrium.

In accordance with one aspect of the exemplary embodiment described here, the actuation system for the individual mirrors is selected depending on the desired properties of the respective mirror. Here, use is made, in particular, of two different holding or mounting techniques, namely semi-active and active mounts, which are intended to be described in the following.

In general, it is possible to distinguish between passive, semi-active and active mounts in lithography apparatuses. In the case of a passive mount, correcting changes in location of the mounted element is not possible or only possible with considerable outlay. In the case of an active mount, the mounted element is mounted via an actuator which enables a correction of changes in location. In this case, provision is made for a control loop, which continuously corrects the location of the mounted element. A correction of changes in location via an actuator is also possible in the case of a semi-active mount. However, this is not brought about by continuous correcting, but rather at periodic intervals, e.g. after each exposure process or once daily or after longer intervals, or as a response to an external signal, e.g. via an input by an operating person.

In the case of a semi-active mount, the optical element is mounted with the aid of a self-holding actuator, by which the position (location and orientation) of the optical element can be adjusted. In the case of the mount via such an actuator, there is a mechanical contact between the optical element and the actuator or the reference structure on which the latter is mounted. The position of the optical element is set by applying a control signal to the actuator. In this case, "self-holding" means that the actuator substantially remains in the current location thereof, even without continuous correction via a control loop. Such an actuator can be configured in such a way that it remains in its current position, even if the control signal is interrupted, i.e., in particular, it does not return to a home position. In this case, provision can optionally also be made for latching elements or similar apparatuses, which ensure remaining in the current location in the case where there is no actuation signal. However, it is also possible that no fixation is provided. (Compared to an active mount,) such a semi-active mount is distinguished by relatively high rigidity, inter alia due to the mechanical contact between optical element and the actuator or the reference structure.

A piezoelectric actuator is a typical example for an actuator for a semi-active mount. Further examples are linear and stepper motors. In the following text, an example for a semi-active mount 200 with a piezoelectric actuator 205 is explained schematically on the basis of FIG. 2. The arrangement of the mount 200, depicted in FIG. 2, includes a piezoelectric actuator 205 and a lever 210, to which the mounted optical element 215 is attached. The piezoelectric actuator 205 includes a piezoelectric stack made out of a stack of piezoelectric elements, which expand or contract by a certain amount when a control voltage is applied. The piezoelectric actuator 205 is situated in a support structure 220, which is rigidly connected to a frame or which else can be part of such a frame. On the other side, the piezoelectric actuator 205 is connected to the optical element 215 via the lever 210. By way of example, the lever 210 is rotatably mounted on a fulcrum 225, which can be attached in relation to e.g. the support structure 220.

The expansion of the piezoelectric stack of the piezoelectric actuator 205 is transferred to the optical element 215 via a lever 210 mounted on the fulcrum 225. Hence, a step-down is achieved, by which expansions of the piezoelectric stack in the millimeter range can be stepped down to ranges of the optical element 215 of e.g. up to 20 µm. Hence, it is possible to achieve a very precise actuation of the optical element 215.

Moreover, a measurement region 230 for determining (registering) the position of the optical element 215 is provided at the end of the lever 210 distant from the optical element 215. By way of example, this measurement region 230 can be part of a sensor arrangement 235, by which a deflection of the lever 210 in relation to a reference point is established. By way of example, the measurement region 230 can be a reflective surface, from which the laser light, which is emitted by an interferometer serving as sensor 240, is reflected, or which is optically registered by an element arranged opposite thereto. The measurement region 230 can also be part of a capacitive sensor or the like. The sensor 240 opposite to the measurement region 230 is mounted on a measurement frame 250, which serves as reference structure.

The deflection of the measurement region 230 is always proportional to the deflection of the optical element 215, and so it is possible to deduce the position of the optical element 215 by registering (determining) the position of the measurement region 230. Due to the lever effect of the lever 210 mounted at the fulcrum 225, the deflection of the measurement region 230 in this case is much larger than the deflection of the optical element 215. Consequently, the location of the optical element 215 can be registered with high precision via this arrangement.

Registering the location of the optical element 215 and the correction thereof is not brought about continuously, but rather at periodic intervals, e.g. after every exposure process or once daily or at longer intervals, or as a response to an external signal, for example via an input by an operating person.

Figure 2:
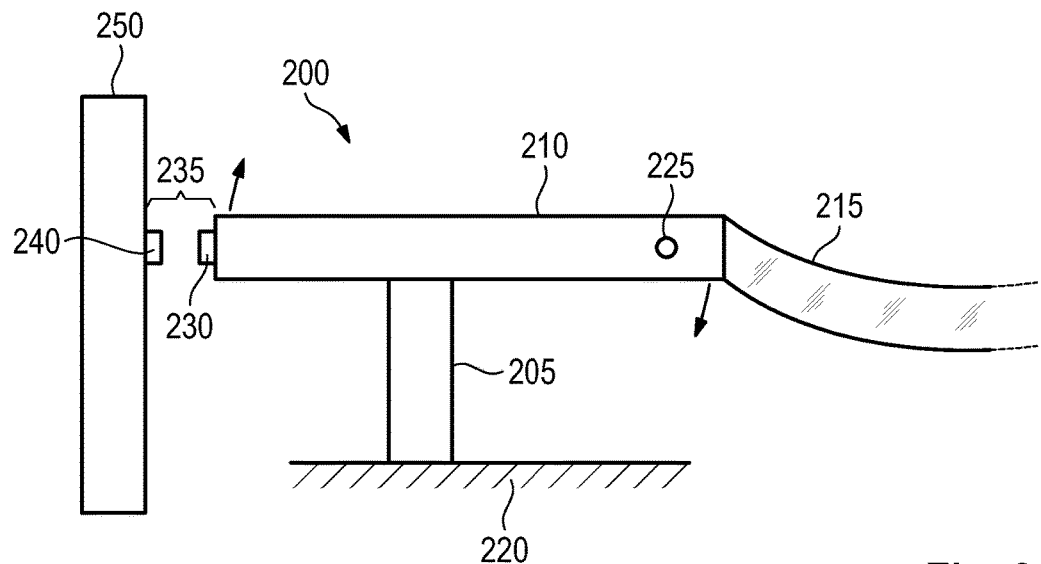
FIG. 2 schematically illustrates a semi-active mount with the aid of a piezoelectric actuator.

It should be noted that, in FIG. 2, the actuation and location registration of the optical element 215 is merely depicted schematically for one degree of freedom. However, in actual fact, the actuation and location registration of the optical element 215 is possible for a plurality of degrees of freedom, in particular for five or six degrees of freedom (three translational and three rotational). Thus, accordingly, it is possible to provide e.g. six actuators and six sensors for one optical element 215.

A typical example for an actuator with an active mount is a Lorentz actuator. In the following text, an active mount via a Lorentz actuator 300 is intended to be explained on the basis of FIG. 3. The Lorentz actuator 300 includes a magnet coil 305 and a plunger-type armature 310, the one side of which is introduced into the magnet coil 305 in the axial direction. On the other side thereof, the plunger-type armature 310 is coupled to an optical element 315, e.g. a mirror. The magnet coil 305 is mounted on a support structure 320, which is rigidly connected to a frame of the lithography apparatus 100, or else which can also be part of such a frame.

The plunger-type armature 310 includes a magnetic material, e.g. a rod-shaped permanent magnet or the like. If a current is now guided through the magnet coil 305, the plunger-type armature 310 moves in the axial direction relative to the magnet coil 305 due to the Lorentz force; this enables an actuation of the optical element 315. A measurement region 330 for registering the position of the optical element 315 is provided on the optical element 315, e.g. on the edge or on the lower side of the optical element 315. By way of example, this measurement region 330 can serve as part of a sensor arrangement 335, by which a deflection of the optical element 315 is established in relation to a reference point. By way of example, the measurement region 330 can be a reflective surface, from which the laser light, which is emitted by an interferometer serving as sensor 340, is reflected, or which is optically registered by an element arranged opposite thereto. The sensor 340 opposite the measurement region 330 is mounted on the measurement frame 250 which can serve as a reference structure. Thus, in the depicted arrangement, there is a subdivision into a force-receiving structure (support structure 320) and a reference structure (measurement frame 250). As a result of this arrangement, the dynamic actuator forces are kept away from the reference structure. It is also possible to attach the optical element 315 directly on the reference structure, i.e. the measurement frame 250, via the Lorentz actuator; however, in this case, it is advantageous to provide reaction masses for decoupling the reaction forces occurring during the actuation. This will still be explained in more detail below.

The sensor 340 determines the location of the measurement region 330 (and consequently the location of the optical element 315) and generates a sensor signal indicating the location, which sensor signal is fed to a control device 350 by the sensor. The control device 350 evaluates this sensor signal and generates a control signal, which it feeds to the magnet coil 305, and by which control signal possible changes in location of the plunger-type armature 310 can be compensated for. Hence, the magnet coil 305, the plunger-type armature 310, the sensor arrangement 335 and the control device 350 form a control loop for regulating the location of the optical element 315.

One feature of the above-described active mount of non-self-holding actuators is therefore the continuous correction of the location of the optical element 315 via a control loop. Here, a control signal from the control device 350 is continuously applied to the magnet coil 305. If this control signal is not applied, the plunger-type armature 310 returns to a home position, which can be defined e.g. by stopper elements 355 or the like, which are provided on the plunger-type armature 310 or on the optical element 315. In contrast thereto, the above-described semi-active mount substantially remains in the current location thereof, even if the actuation signal to the piezoelectric actuators is switched off.

Figure 3:
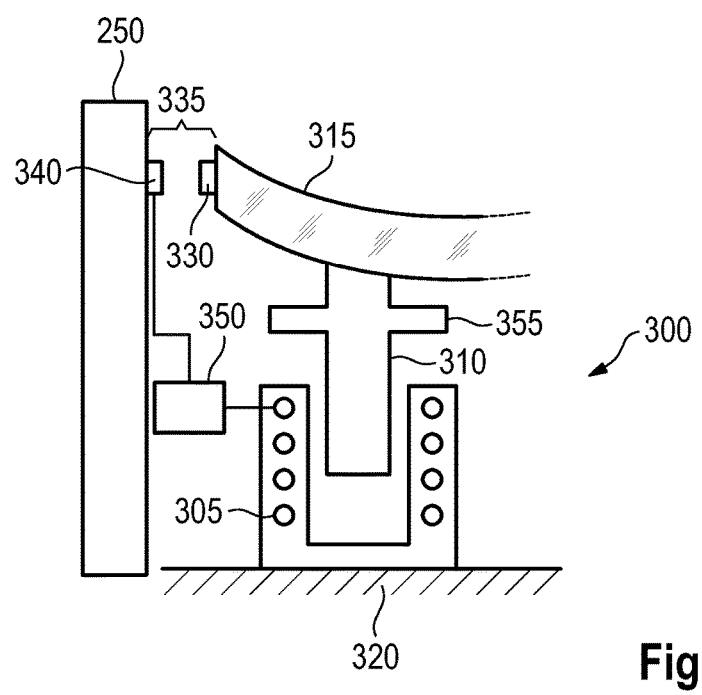
FIG. 3 schematically illustrates an active mount with the aid of a Lorentz actuator.

The actuation and location registration of the optical element 315 are merely depicted schematically for one degree of freedom in FIG. 3 as well, and it is possible to provide e.g. six actuators and six sensors for an optical element 315, in accordance with the number of degrees of freedom.

The mounting techniques described here, i.e. the semi-active and the active mount, each have specific advantages and disadvantages. Thus, the actuation has a substantially simpler design in the case of the semi-active mount since the position of the optical element is not continuously corrected. In contrast thereto, the "flying" active mount involves a highly precise control loop. Moreover, comparatively cost-effective capacitive sensors can be used for semi-active mounts. Furthermore, due to the lever step-down, a relatively small change in the position of the optical element 215 can be converted into a relatively large change in location of the measurement region 230, simplifying a precise measurement. In contrast thereto, the active mount involves a measurement directly on the optical element 315. Furthermore, in the case of good accessibility in the EUV lithography apparatus 100, it is easier to replace optical elements mounted in a semi-active manner due to their self-holding property, which in turn enables a reduction in costs. Finally, semi-active mounts are subject to lower thermal loads than active mounts with Lorentz actuators, which have relatively large current-carrying coils. In conclusion, semi-active mounts are thus distinguished by a number of aspects which enable a more cost-effective realization than active mounts.

By contrast, active mounts are distinguished by virtue of the fact that they enable more precise positioning of the optical element. Since the Lorentz actuator 300 is continuously corrected, they are also more robust against location-changing environmental influences, which semi-active mounts only correct within the scope of the periodic adjustment. Furthermore, there is no mechanical contact between the magnet coil 305 and the plunger-type armature 310 in the Lorentz actuator 300, and so the rigidity of the actuator is very low and vibrations and the like are not, or only hardly, transferred from the support structure to the optical element 315. Furthermore, active mounts are subject to fewer parasitic effects.

In accordance with one aspect of the disclosure, both of the above-described holding or mounting techniques are employed in an EUV imaging apparatus, such as e.g. the EUV lithography apparatus 100. This is intended to be explained in more detail in the following text on the basis of FIGS. 4 and 5.

Figure 4:
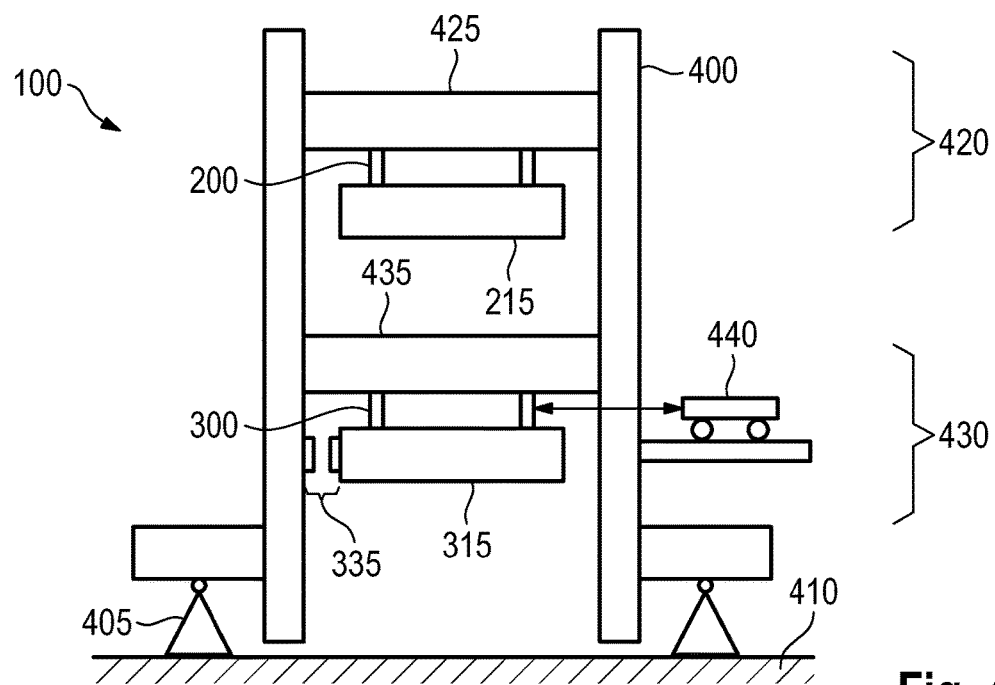
FIG. 4 schematically shows an EUV lithography apparatus with a hybrid mount technique in accordance with a one-frame concept.

FIG. 4 schematically shows an EUV lithography apparatus 100 with a hybrid mounting technique in accordance with a one-frame concept. It should be noted that FIG. 4 (like FIG. 5) is merely a schematic illustration and that, in particular, the number of optical elements does not necessarily correspond to that of an actual system. In particular, all that is depicted in a representative manner is a semi-active and an active system in each case.

In the EUV lithography apparatus 100 in accordance with FIG. 4, a frame 400, which can serve as a reference structure or as a measurement frame, is mounted on a base 410 via an air mount 405. A semi-active system 420 and an active system 430 are attached to the frame 400. The semi-active system 420 includes a support structure 425 securely connected to the frame 400 or attached to the frame 400, on which support structure 425 a mirror 215 serving as optical element is mounted with the aid of self-holding actuators, as depicted in FIG. 2. The active system 430 includes a support structure 435 securely connected to the frame 400, on which support structure 435 a mirror 315 serving as optical element is mounted via Lorentz actuators 300, i.e. with the aid of non-self-holding actuators, as depicted in FIG. 3. The position of the optical element 315 is registered with the aid of a sensor arrangement 335, as described for the arrangement in FIG. 3.

In order to compensate for instabilities, the actuators 300 of the active system are coupled to reaction masses 440, of which merely one is depicted in a representative manner in FIG. 4. These reaction masses 440 are intended to ensure that the reaction forces generated when actuating the optical element 315 are not transmitted to the frame 400. This is because such reaction forces can be transmitted by the frame to other optical elements and the like and can lead to vibrations, which severely impair accurate positioning of the optical elements. The reaction masses 440 are not securely connected to the frame 400, but rather coupled to the frame 400 via air mounts or the like.

Using this hybrid system, it is possible to employ the advantages of both above-described holding or mounting techniques. As a result, it is possible to reduce the complexity, and consequently the production costs, of the EUV lithography apparatus.

By way of example, the optical elements mounted via the semi-active mount can be optically less sensitive than the optical elements mounted via the active mount. In particular, the illumination mirrors in the illumination system 104 in FIG. 1 can be mounted in a semi-active manner. Moreover, optical elements which are moved relatively frequently can be mounted via an active mount, whereas relatively stationary optical elements can be mounted via a semi-active mount. Furthermore, it is possible to mount near-field optical elements in an active manner and to mount near-pupil optical elements in a semi-active manner. Here, those optical elements in which the ratio SA/CA<0.6 is satisfied are referred to as near-field elements and those optical elements in which the ratio SA/CA≥0.6 is satisfied are referred to as near-pupil elements, where SA denotes the sub-aperture and CA denotes the clear aperture. Here, the sub-aperture SA is the maximum region on the optical element which is illuminated by an individual field point on the object to be imaged. The clear aperture CA is the region on the optical element which is illuminated by all field points on the object to be imaged. An explanation of the terms sub-aperture SA and clear aperture CA is also found in US2009/0080086A1, paragraphs [0097] ff.

In a non-limiting example, the near-pupil mirrors 116, 118 and 124 in FIG. 1 can be mounted in a semi-active manner and the near-field mirrors 112 and 126 in FIG. 1 can be mounted in an active manner.

Figure 5:
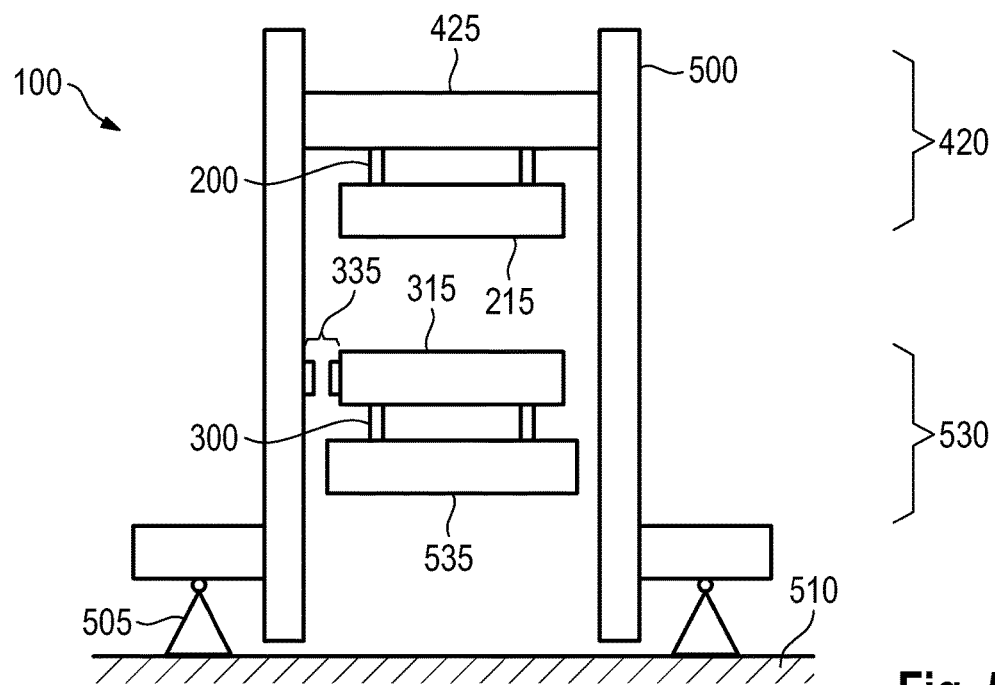
FIG. 5 schematically shows an EUV lithography apparatus with a hybrid mount technique in an alternative configuration in accordance with a two-frame concept.

FIG. 5 schematically shows an EUV lithography apparatus 100 with a hybrid mounting technique in an alternative configuration in accordance with a two-frame concept. A frame 500 is also mounted on a base 510 via an air mount 505 in the EUV lithography apparatus 100 in accordance with FIG. 5. Once again, a semi-active system 420 and an active system 530 are mounted on the frame 500. The semi-active system 420 corresponds to that depicted in FIG. 4 and is therefore not explained in any more detail. By contrast, the active system 530 differs from the active system 430 to the extent that the optical element 315 is mounted on a force-receiving support structure 535 via Lorentz actuators 300, which support structure 535 is not directly connected to the frame 500, which serves as a reference structure. Using this arrangement, the reaction forces when actuating the mirror 315 are not directly transmitted to the frame 500 since the second support structure 535 is mechanically decoupled from the frame 500 serving as a reference structure, and so it is possible to dispense with reaction masses for compensating these reaction forces.

One mirror of the various mirrors of the lithography apparatus 100 serves as reference mirror. The positions of the other mirrors are aligned by referencing the position of this reference mirror to each respective mirror. Here, it is advantageous if the reference mirror is "fixedly" connected to the measurement frame, i.e. attached to the latter with great rigidity. It is for this reason that one of the mirrors with a semi-active mount is utilized as a reference mirror in the hybrid system, proposed here, of mirrors with an active mount and mirrors with a semi-active mount. In principle, a mirror attached to a reference structure in a semi-active manner can replace a passive reference mirror.

However, the following problem can occur in the registration, depicted in FIG. 2, of the position of the optical element 215 mounted in a semi-active manner: a plurality of attachment surfaces or interfaces are provided between the measurement region 230 and the optical element 215, for example between the optical element 215 and the lever 210, which attachment surfaces or interfaces are subject to relaxation processes and environmental influences. This can lead to sensor drift, i.e. a long-term change in the sensor signal relative to the measurement variable.

Figure 6:
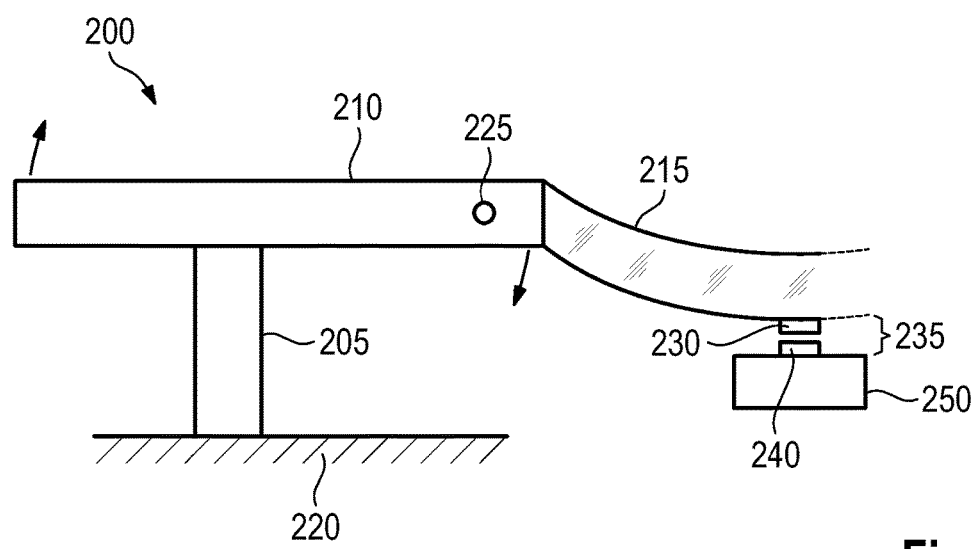
FIG. 6 shows an alternative configuration of a semi-active actuator arrangement.

In order to respond to this, the sensor arrangement 235 in the configuration of the semi-active system proposed in FIG. 6 is not provided on the mount 200 (on the end of the lever 210 distant from the optical element 215), but rather directly on the optical element 215. By way of example, the measurement region 230 can be provided on the rear side, or else on the edge, of the optical element 215. Using this arrangement, it is possible to avoid falsification of the sensor signal due to sensor drift and it is consequently possible to meet the higher requirements of an EUV lithography apparatus.

At least in the case of the reference mirror mounted in a semi-active manner, the sensor arrangement 235 is provided directly on the optical element 215 instead of on the mount 200; however, optionally, a corresponding arrangement of the sensor arrangement 235 directly on the optical element 215 can also be brought about for the other optical elements mounted in a semi-active manner.

It should be noted that the embodiments described above are merely exemplary and can be varied in multifaceted ways within the scope of protection of the patent claims. In particular, the features of the embodiments described above can also be combined with one another.

For example, EUV lithography apparatuses were mentioned in the exemplary embodiments above. However, the disclosure is not restricted thereto, but can also be applied to mask metrology apparatuses, such as e.g. AIMS (aerial image measurement system) apparatuses or APMI (aerial pattern mask inspection) apparatuses.

LIST OF REFERENCE SIGNS

100 EUV lithography apparatus
102 Beam shaping system
104 Illumination system

106 Projection system
108 EUV light source
110 Collimator
112 Monochromator
114 EUV radiation
116 First mirror
118 Second mirror
120 Photomask
122 Wafer
124 Third mirror
126 Fourth mirror
200 Mount
205 Piezoelectric actuator
210 Lever
215 Optical element
220 Support structure
225 Fulcrum
230 Measurement region
235 Sensor arrangement
240 Sensor
250 Measurement frame
300 Lorentz actuator
305 Magnet coil
310 Plunger-type armature
315 Optical element
330 Measurement region
335 Sensor arrangement
340 Sensor
350 Control device
355 Stopper elements
400 Frame
405 Air mount
410 Base
420 Semi-active system
425 First support structure
430 Active system
435 Second support structure
440 Reaction mass
500 Frame
505 Air mount
510 Base
530 Active system
535 Second support structure

What is claimed is:

1. An imaging apparatus, comprising:
a reference structure;
a first actuator;
a second actuator;
a first optical element actuatable relative to the reference structure via the first actuator; and
a second optical element actuatable relative to the reference structure via the second actuator,
wherein:
the first actuator is a self-holding actuator that is semi-actively controlled;
the second actuator is a non-self holding actuator;
the second actuator is actively controlled with the aid of a control loop; and
the imaging apparatus is an EUV imaging apparatus.

2. The imaging apparatus of claim 1, wherein the first optical element is in a near-pupil arrangement.

3. The imaging apparatus of claim 2, wherein the second optical element is in a near-field arrangement.

4. The imaging apparatus of claim 1, wherein the second optical element is in a near-field arrangement.

5. The imaging apparatus of claim 1, wherein:
the first optical element is mounted on a first support structure;
the first support structure is attached to the reference structure;
the second optical element is mounted on a second support structure; and
the second support structure is attached to the reference structure.

6. The imaging apparatus of claim 1, further comprising a reaction mass configured to compensate forces generated during use of the imaging apparatus when actuating the second optical element.

7. The imaging apparatus of claim 1, wherein:
the first optical element is mounted on a first support structure;
the first support structure is attached to the reference structure;
the second optical element is mounted on a second support structure; and
the second support structure is mechanically decoupled from the reference structure.

8. The imaging apparatus of claim 1, wherein:
the imaging apparatus is configured to actuate the first actuator: a) at regular intervals to correct a location of the first actuator; or b) in response to an external signal to correct the location of the first actuator; and
the imaging apparatus is configured to correct a location of the second actuator continuously with the aid of a control loop.

9. The imaging apparatus of claim 1, wherein the first actuator comprises an actuator selected from the group consisting of a piezoelectric actuator, a magnetostrictive actuator, and a linear motor.

10. The imaging apparatus of claim 9, wherein the second actuator comprises a Lorentz actuator.

11. The imaging apparatus of claim 1, wherein the second actuator comprises a Lorentz actuator.

12. The imaging apparatus of claim 1, wherein the first optical element comprises a first mirror, and the second optical element comprises a second mirror.

13. The imaging apparatus of claim 12, comprising near-field mirror elements mounted in an active manner.

14. The imaging apparatus of claim 13, comprising near-pupil mirror elements mounted in a semi-active manner.

15. The imaging apparatus of claim 12, comprising near-pupil mirror elements mounted in a semi-active manner.

16. The imaging apparatus of claim 1, wherein an optical sensitivity of the second optical element is greater than an optical sensitivity of the first optical element.

17. The imaging apparatus of claim 1, further comprising a first sensor device configured to determine a position of the first optical element directly on the first optical element.

18. The imaging apparatus of claim 17, wherein the position of the first optical element is a reference for positioning the second optical element.

19. The imaging apparatus of claim 18, further comprising a second sensor device configured to determine a position of the second optical element, wherein:
the first sensor device is configured to determine the position of the first optical element at specific time intervals or as a response to an external signal; and
the second sensor device is configured to determine the position of the second optical element continuously.

20. The imaging apparatus of claim 1, wherein the imaging apparatus is an EUV lithography apparatus.

21. The imaging apparatus of claim 1, wherein the imaging apparatus is a mask metrology apparatus.

* * * * *

UNITED STATES PATENT AND TRADEMARK OFFICE
CERTIFICATE OF CORRECTION

PATENT NO. : 9,904,175 B2
APPLICATION NO. : 14/937340
DATED : February 27, 2018
INVENTOR(S) : Jens Kugler, Stefan Hembacher and Michaela Schmid Page 1 of 1

It is certified that error appears in the above-identified patent and that said Letters Patent is hereby corrected as shown below:

In the Claims

Column 12, Line 27: In Claim 8, delete "orb)" and insert -- or b) --, therefor.

Signed and Sealed this
Twenty-fourth Day of April, 2018

Andrei Iancu
*Director of the United States Patent and Trademark Office*